(12) United States Patent
Lichtenstein et al.

(10) Patent No.: US 6,624,383 B1
(45) Date of Patent: Sep. 23, 2003

(54) USING LASER ETCHING TO IMPROVE SURFACE CONTACT RESISTANCE OF CONDUCTIVE FIBER FILLER POLYMER COMPOSITES

(75) Inventors: Parker Ross Lichtenstein, Newark, OH (US); Hong Peng, Pickerington, OH (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 09/651,353

(22) Filed: Aug. 30, 2000

(51) Int. Cl.$^7$ .............................................. B23K 26/00
(52) U.S. Cl. .................... 219/121.69; 219/121.68; 219/121.67
(58) Field of Search ................ 219/121.69, 121.67, 219/121.68, 121.85, 121.6

(56) References Cited

U.S. PATENT DOCUMENTS

| | | |
|---|---|---|
| 4,061,799 A | 12/1977 | Brewer |
| 4,882,200 A | 11/1989 | Liu et al. |
| 4,894,115 A | 1/1990 | Eichelberger et al. |
| 4,973,514 A | 11/1990 | Gamble et al. |
| 5,169,678 A | 12/1992 | Cole et al. |
| 5,399,295 A | 3/1995 | Gamble et al. |
| 5,401,913 A * | 3/1995 | Gerber et al. ................ 174/264 |
| 5,505,320 A | 4/1996 | Burns et al. |
| 5,577,309 A | 11/1996 | Frank et al. |
| 5,603,848 A | 2/1997 | Beratan et al. |
| 5,702,565 A | 12/1997 | Wu et al. |
| 5,906,042 A * | 5/1999 | Lan et al. ...................... 29/852 |
| 5,928,547 A * | 7/1999 | Shea et al. ................... 219/505 |
| 5,939,783 A * | 8/1999 | Laine et al. ................. 257/702 |
| 6,036,809 A | 3/2000 | Kelly et al. |
| 6,063,695 A | 5/2000 | Lin et al. |
| 6,238,599 B1 * | 5/2001 | Gelorme et al. ............ 252/514 |

FOREIGN PATENT DOCUMENTS

EP 0 431 334 A2 6/1991

* cited by examiner

Primary Examiner—M. Alexandra Elve
(74) Attorney, Agent, or Firm—John A. Molnar, Jr.

(57) ABSTRACT

A method for improving the line or point-to-point surface contact resistance of an electrically conductive fiber filled polymer composite includes the laser evaporating of a thin polymer layer from the surface of the composite and exposing of the electrically conductive fiber/particle network underneath. The surface of the composite laser is etched to a depth between about 1 and 250 microns.

5 Claims, 1 Drawing Sheet

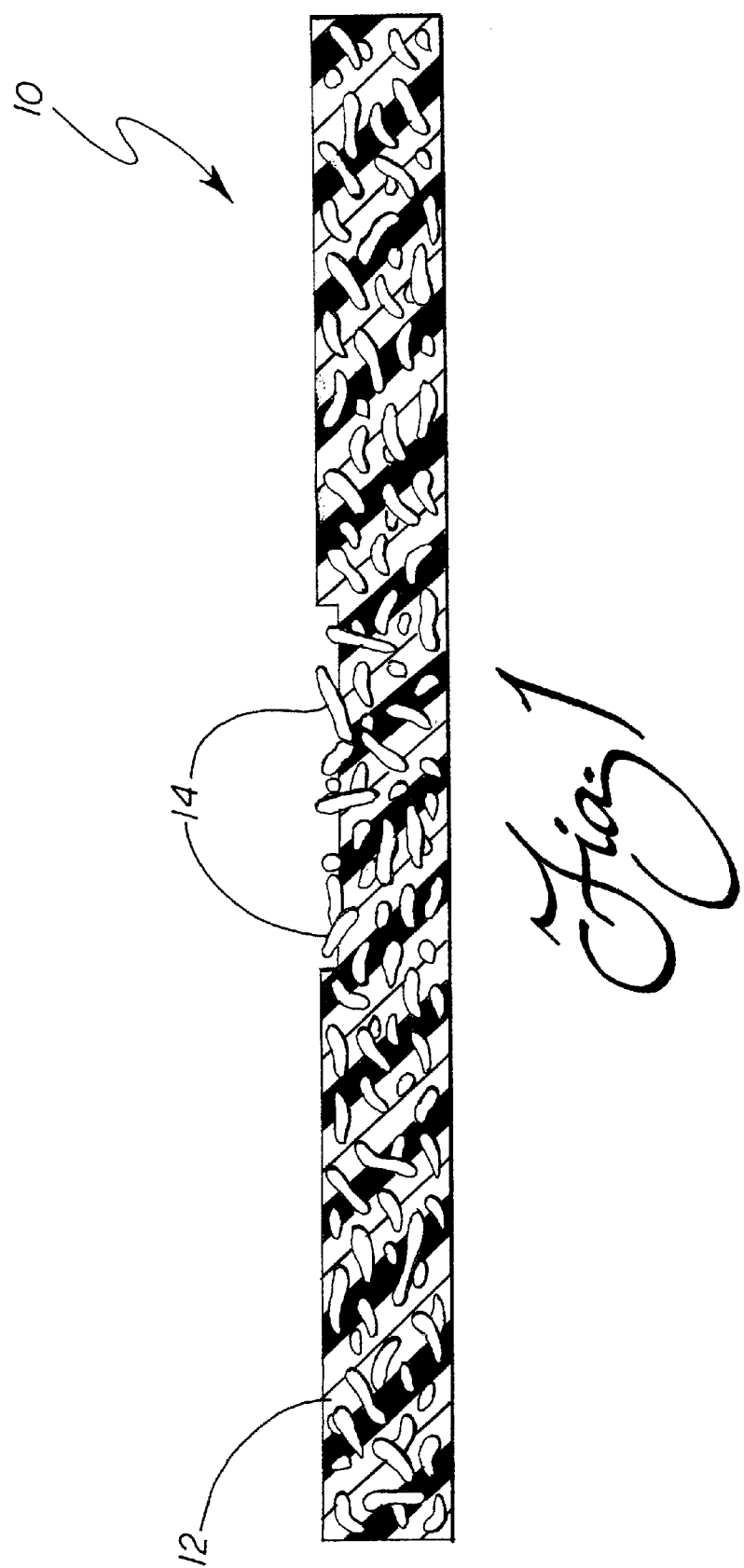

USING LASER ETCHING TO IMPROVE SURFACE CONTACT RESISTANCE OF CONDUCTIVE FIBER FILLER POLYMER COMPOSITES

TECHNICAL FIELD AND INDUSTRIAL APPLICABILITY OF THE INVENTION

The present invention relates generally to electrically conductive fiber filled polymer composites characterized by improved line or point-to-point conductivity and enhanced electromagnetic interference shielding effectiveness.

BACKGROUND OF THE INVENTION

In today's electronic age and particularly as a result of advances in digital technologies, electrical malfunctions resulting from electromagnetic interference (EMI) have been proliferating. Recently, ever-increasing numbers of cordless and cellular phone users have compounded the problem. As a result, interference with television and telephone reception, and the proper operation of various instruments such as flight instruments in an airplane as well as the inadvertent activation of electrically controlled devices such as garage door openers now commonly occur.

In an effort to address this problem, manufacturers are seeking ways to provide finished parts with improved EMI shielding characteristics. Toward this end it is known to utilize metal paint application (e.g., silver, copper, nickel), cathode sputtering, foil application, vacuum metalizing, electroplating, flame/arc spraying and graphite paint application. While useful, these techniques generally suffer from one or more drawbacks including but not limited to high processing costs and a limited service life due to chipping, cracking and/or peeling of the surface treatment.

Electrically conductive fiber-filled polymer composites generally avoid these problems. Specifically, the composites are typically molded to provide a housing, cover or shroud providing desired EMI shielding characteristics. Unfortunately, due to the thin layer of polymer on the surface of the molded parts or the occasional presence of resin rich areas/spots on the surface thereof line or point-to-point surface contact resistance is usually very high. For many applications in the electronic industry, the line or point-to-point contact resistance must be very low in order to form a complete electrically conductive path and to be EMI shielding effective. Thus, a need is identified for improving the line or point-to-point contact resistance on the surface of a conductive fiber filled polymer composite.

SUMMARY OF THE INVENTION

In accordance with the purposes of the present invention as described herein, a method is provided for improving the line or point-to-point surface contact resistance of an electrically conductive fiber filled polymer composite. The method includes evaporating a thin polymer layer on a surface of the conductive fiber filled polymer composite and exposing an electrically conductive fiber network underneath. The evaporating may be performed by using a laser.

The method may also be described as using a laser with a laser power level of between about 3 to about 150 watts to evaporate a thin polymer layer on a surface of the conductive fiber filled polymer composite to a depth of between about 1 to about 250 microns and exposing an electrically conductive fiber network.

The method may be further described as including the step of moving the laser at a laser head speed of between about 1 to about 500 inches/second across the surface of the composite. Thus, the method includes the etching of a pattern across the surface of the electrically conductive fiber filled polymer composite.

In accordance with yet another aspect of the present invention, an EMI shielding apparatus is provided comprising an electrically conductive fiber filled polymer composite having an etched surface exposing an electrically conductive fiber filled network underneath. The etching is to a depth of between about 1 to about 250 microns.

Still other objects of the present invention will become readily apparent to those skilled in this art from the following description wherein there is shown and described a preferred embodiment of this invention simply by way of illustration of one of the modes best suited to carry out the invention. As it will be realized, the invention is capable of other different embodiments and its several details are capable of modification in various, obvious aspects all without departing from the invention. Accordingly, the drawings and descriptions will be regarded as illustrative in nature and not as restrictive.

BRIEF DESCRIPTION OF THE DRAWING

The accompanying drawing incorporation in and forming a part of the specification, illustrates several aspects of the present invention, and together with the description serves to explain the principles of the invention. In the drawing:

FIG. 1 is a cross sectional view of the present invention showing the etching of the surface thereof to expose the electrically conductive fiber network underneath.

Reference will now be made in detail to the present preferred embodiment of the invention, an example of which is illustrated in the accompanying drawing.

DETAILED DESCRIPTION OF THE INVENTION

Reference is now made to FIG. 1 illustrating an EMI shielding apparatus 10 which is molded or otherwise constructed from an electrically conductive fiber filled polymer composite material into substantially any desired shape. The apparatus 10 shown for purposes of illustration is a plate-like cover such as may be utilized to shield an electronic component or other article from electromagnetic radiation including but not limited to radio frequency waves.

The electrically conductive fiber filled polymer composite material may incorporate substantially any resin or polymer and substantially any electrically conductive fiber/particle suitable for the intended purpose. Polymer materials that may be utilized include but are not specifically limited to polycarbonate (PC), acrylonitrile butadiene styrene (ABS), blends of PC and ABS (PC/ABS), polyethylene terephthalate (PET), polybutylene terephthalate (PBT), polyamide (PA or nylon), polystyrene (PS), polypropylene (PP), polyethylene (PE), polyphenylene sulfide (PPS), polyphenylene oxide (PPO), syndiotactic polystyrene (SPS), thermoplastic elastomer (TPE), liquid crystal polymer (LCP), polyvinyl chloride (PVC), polyacrylate, polyurethane (PUR) and acetal copolymer (POM). Essentially all thermoset resins that may be used to produce molded articles (e.g. epoxy resins, polyester resins and phenolic resins) may be used in the present invention.

Fiber materials with measurable electrical conductivity that may be utilized include but are not limited to carbon, graphite, stainless steel, nickel, copper, iron, steel, silver, gold, aluminum and any combination of metals and carbon or glass or plastic particles or fibers (e.g., metal plated glass beads and/or fibers, metal plated carbon fibers or particles, metal plated plastic beads or fibers.)

Fiber loading may be anywhere between about 5 to about 40% and more typically falls in a range between about 10 to about 20%. The composite material may be prepared in a number of ways including but not limited to extrusion compounding with a polymer and a chopped conductive is fiber or particles; pultrusion or wire-coating polymer over conductive long-fiber. Output from the above two typical processing methods is subsequently pelletized to a nominal length of from 0.125 to 0.375 inches. Additionally, chopped conductive fibers may be dry-blended with polymer pellets as a master batch.

The resulting polymer composite material is molded into substantially any desired shape so as to provide a housing shield or shroud to cover an article and thereby provide the desired EMI shielding to the article. While useful for many applications, "as molded", electrically conductive fiber filled polymer composites suffer from some limitations, such as lower line or point-to-point surface conductivity and poor aesthetics. Specifically, when flat surfaces of two "as molded" composite parts are pressed together with a relatively large contacting area or interface, the surface conductivity (ohm/sq) is generally acceptable for most applications. However, when measured by using a point-to-point contact resistance method, such as using two probes with needle points from a standard ohm-meter, the readings of surface contact resistance are usually very high and sometimes not even measurable. The thin covering layer of polymer on the surface of the parts, or sometimes the presence of resin rich areas/spots on the surface of the molded parts are the main cause for this phenomenon.

Unfortunately, the high line or point-to-point surface contact resistance of as molded composite parts prevents their use for many EMI shielding applications. For example, many applications in the electronic industry require low line or point-to-point contact resistance in order to form a complete electrically conductive path necessary to be EMI shielding effective.

In accordance with the present invention, it is possible to significantly improve the line or point-to-point surface contact resistance of the electrically conductive fiber filled polymer composite 10. This is done by evaporating a thin polymer layer from the surface of the composite 10 thereby exposing the electrically conductive fiber network underneath. Specifically, the surface 12 of the apparatus 10 is etched to a depth of between about 1 to about 250 microns and more typically to between about 1 to about 50 microns. The exposed electrically conductive fiber network 14 that results significantly reduces the line or point-to-point surface contact resistance of the apparatus by perhaps a factor of 10–100. In some cases the effect will change a non conductive surface to one with measurable conductivity. As a consequence, the apparatus 10 is characterized by the necessary line or point-to-point surface contact resistance to allow its use for many additional applications for which as molded composites are not generally suited.

The evaporating or etching may be performed by using a laser. Many different types of lasers may be used for this purpose including but not necessarily limited to dot matrix, focused-spot and stencil (mask) systems. Lasers useful for the intended purpose include but are not limited to (1) stroke Nd: YAG, (neodymium doped yttrium aluminum garnet) CW (continuous wave) diode-pumped (2) Nd:YAG, CW lamp-pumped, (3) frequency-doubled ND:YAG, (4) helium-neon, (5) stroke $CO_2$, sealed RF excited, (6) mask $CO_2$, pulsed TEA and (7) mask Excimer, pulsed.

The laser is operated at a power level of between about 3 to about 150 watts and more typically between about 10 to about 50 watts. The laser may be moved across the surface of the composite or apparatus 10 at a laser head speed of between about 1 to about 500 inches/second and more typically about 10 to about 100 inches/second. This allows the etching of a pattern across the surface of the apparatus 10. Such a pattern may be matched with the etched pattern on an adjacent apparatus 10 in order to provide desired line or point-to-point surface contact resistance customized for a particular application.

Of course, it should be appreciated that the etching also functions to reduce the variability of the surface contact resistance of the apparatus. If desired, the power level of the laser as well as the direction and speed of movement of the laser head may also be controlled by computer program. This allows the automated, high speed etching of even complicated patterns and the production of parts or apparatus 10 with generally consistent overall properties and line or point-to-point contact resistance. Further, laser etching is relatively low in, cost using only, electrical power. In addition, the laser etching changes the surface texture of the molded parts advantageously enhancing the adhesion of two different parts or materials wherever a joint is necessary.

The following examples are presented to further illustrate the invention, but it is not to be considered as being limited thereto.

EXAMPLE 1

Seven inch diameter round plaques of electrically conducting fiber filled polymer composite material 1 mm thick were etched or engraved using a Xenetch laser engraving system. The laser was generated by using a $CO_2$ tube with a laser beam width of 0.003 inch and an x–y table dimension of 18"×30". The maximum power level was 25 watts. The maximum laser head speed was 100 inch/second. The engraving pattern was 1 cm×1 cm squares in spacing of 1 cm to produce 3 or 4 squares per sample. The cutting depth varied depending upon the power level, laser head speed and density of the composite material. The type of polymer, type of fiber and fiber load rate for various plaques etched in this example and the results of the laser etching a represented in Table 1 below.

TABLE 1

| Sample | Fiber | Resin | Thickness mm | Power watt | Speed inch/sec | Surface Conductivity, @ 50 psi before laser etching, ohm/sqr | Surface Conductivity, @ 50 psi after laser etching, ohm/sqr |
|---|---|---|---|---|---|---|---|
| 1 | 15% NiCF | Nylon 66 | 3.2 | 25 | 50 | 3 | 0.3 |
| 2 | 15% NiCF | PCABS | 3.2 | 25 | 50 | 4 to 8 | 1 to 2 |
| 3 | 15% NiCF | PCABS | 3.2 | 25 | 50 | 6 to 30 | 0.8 to 1.5 |

TABLE 1-continued

| Sample | Fiber | Resin | Thickness mm | Power watt | Speed inch/sec | Surface Conductivity, @ 50 psi before laser etching, ohm/sqr | Surface Conductivity, @ 50 psi after laser etching, ohm/sqr |
|---|---|---|---|---|---|---|---|
| 4 | 15% NiCF | PCABS | 3.2 | 25 | 50 | 4 to 8 | 1 |
| 5 | 15% NiCF | TPE | 3.2 | 25 | 50 | 50 to 30k | 15 to 20 |

EXAMPLE 2

In this experiment, plaques 7 inches in diameter and various thickness were selected for Nickel coated carbon fiber filled polymer composite. A qurdrant surface of each plaque was etched by using the same $CO_2$ laser as example #1 for each given processing conditions. The surface conductivity in ohms per square was measured under the pressure of 1 psi. The results are summarized in Table 2.

TABLE 2

| Sample | Fiber | Resin | Thickness mm | Power watt | Speed inch/sec | Surface Conductivity, @ 1 psi before laser etching, ohm/sqr | Surface Conductivity, @ 1 psi after laser etching, ohm/sqr |
|---|---|---|---|---|---|---|---|
| 1 | 10% NiCF | PCABS | 2 | 25 | 45 | >20M | 3.2 |
| 2 | 15% NiCF | PCABS | 1 | 25 | 45 | 75 | 2.5 |
| 3 | 15% NiCF | PBT | 1 | 25 | 45 | >20M | 4.5 |
| 4 | 15% NiCF | Nylon 6 | 1 | 25 | 45 | 10k | 4.7 |
| 5 | 20% NiCF | PCABS | 1 | 25 | 45 | 42 | 1.7 |

EXAMPLE 3

In this experiment, plaques 7 inches in diameter and 1 mm thick were selected for each electrically conducting fiber filled polymer composite. Three squares of 1 cm×1 cm were etched into the surface of each plaque using a $CO_2$ laser for each given set of processing conditions. The results are summarized in Table 3 below.

TABLE 3

| Sample | Fiber | Resin | Thickness mm | Power watt | Speed inch/sec | 2 points contact resistance before laser etching, ohms | 2 points contact resistance after laser etching, ohms |
|---|---|---|---|---|---|---|---|
| 1 | 10% NiCF | PCABS | 1 | 25 | 30 | >10k | 35 |
| 2 | 10% NiCF | PCABS | 1 | 15 | 30 | >10k | 37 |
| 3 | 10% NiCF | PCABS | 1 | 25 | 60 | >10k | 33 |
| 4 | 15% NiCF | PCABS | 1 | 25 | 30 | >1k | 7 |
| 5 | 15% NiCF | PCABS | 1 | 15 | 30 | >1k | 14 |
| 6 | 15% NiCF | PCABS | 1 | 25 | 60 | >1k | 8 |

The foregoing description of a preferred embodiment of the invention has been presented for the purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical applications to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed:

1. A method of improving line/point-to-point surface contact resistance of an electrically conductive fiber/particle filled polymer composite having a surface, said method comprising:

evaporating a thin polymer layer on said surface of said electrically conductive fiber filled polymer composite and exposing an electrically conductive fiber network underneath said layer, wherein said evaporating is performed using a laser.

2. A method of improving line/point-to-point surface contact resistance of an electrically conductive fiber/particle filled polymer composite having a surface, the method comprising:

using a laser with a laser power level of between about 3 to about 150 watts to evaporate a thin polymer layer on said surface of said electrically conductive fiber filled polymer composite to a depth of between about 1 to about 250 microns and exposing an electrically conductive fiber/particle network underneath said layer.

3. The method of claim 2, further including moving said laser at a laser head speed of between about 1 to about 500 inches/second.

4. The method of claim 3, including etching a pattern across said surface of said electrically conductive fiber/particle filled polymer composite.

5. The method of claim 1 including etching a pattern across said surface of said electrically conductive fiber/particle filled polymer composite.

* * * * *